(12) United States Patent
Schultz et al.

(10) Patent No.: US 8,457,573 B2
(45) Date of Patent: Jun. 4, 2013

(54) AUTOMATIC GAIN CONTROL WITH STATE MACHINE CONTROLLER FEEDBACK

(75) Inventors: Mark Alan Schultz, Carmel, IN (US); Rod Anthony Diemer, Indianapolis, IN (US); Robert Andrew Rhodes, Carmel, IN (US)

(73) Assignee: Thomson Licensing, Issy les Moulineaux (FR)

( * ) Notice: Subject to any disclaimer, the term of this patent is extended or adjusted under 35 U.S.C. 154(b) by 262 days.

(21) Appl. No.: 12/863,031

(22) PCT Filed: Jan. 16, 2008

(86) PCT No.: PCT/US2008/000552
§ 371 (c)(1),
(2), (4) Date: Jul. 15, 2010

(87) PCT Pub. No.: WO2009/091364
PCT Pub. Date: Jul. 23, 2009

(65) Prior Publication Data
US 2011/0053543 A1 Mar. 3, 2011

(51) Int. Cl.
*H04B 17/02* (2006.01)
(52) U.S. Cl.
USPC .......................................... 455/136; 455/138
(58) Field of Classification Search
USPC ................ 455/136, 138, 232.1, 240.1, 250.1, 455/245.1
See application file for complete search history.

(56) References Cited

U.S. PATENT DOCUMENTS

| | | | | |
|---|---|---|---|---|
| 6,137,647 A | * | 10/2000 | Voorman et al. | 360/67 |
| 6,167,246 A | * | 12/2000 | Elder et al. | 455/313 |
| 6,295,445 B1 | * | 9/2001 | Uesugi | 455/234.1 |
| 6,748,200 B1 | | 6/2004 | Webster et al. | |
| 6,885,851 B1 | * | 4/2005 | Miura | 455/234.1 |
| 6,965,655 B1 | | 11/2005 | Mostov et al. | |
| 7,580,482 B2 | * | 8/2009 | Endres et al. | 375/326 |
| 7,869,549 B2 | * | 1/2011 | Yang et al. | 375/345 |
| 2002/0098814 A1 | | 7/2002 | Steber et al. | |
| 2004/0052319 A1 | | 3/2004 | Wakamatsu | |
| 2005/0100119 A1 | | 5/2005 | Husted et al. | |

FOREIGN PATENT DOCUMENTS

| | | |
|---|---|---|
| CN | 1423486 | 6/2003 |
| CN | 1510909 | 7/2004 |
| EP | 1401134 A1 | 3/2004 |
| EP | 1780915 A1 | 5/2007 |
| FR | 2830390 A1 | 4/2003 |
| JP | 08293748 A | 11/1996 |
| JP | 2003069546 A | 3/2003 |
| JP | 2003092561 A | 1/2005 |
| JP | 2005020120 A | 1/2005 |
| WO | 2007147853 A1 | 12/2007 |

* cited by examiner

*Primary Examiner* — Sonny Trinh
(74) *Attorney, Agent, or Firm* — Robert D. Shedd; Jeffrey M. Navon; Catherine A. Cooper

(57) ABSTRACT

An automatic gain control circuit is described including a state machine controller for adjusting intermediate frequency gain and radio frequency gain and a baseband demodulator, wherein the baseband demodulator receives information from the state machine controller regarding status of the state machine controller and further wherein the state machine controller receives correlation information from the baseband demodulator. Also described is a method including detecting a signal, providing state machine controller information to a baseband demodulator, reducing a radio frequency gain, reducing an intermediate frequency gain and receiving correlation information from the baseband demodulator.

9 Claims, 9 Drawing Sheets

Typical AGC Loop

AGC Loop with State Machine Feedback to Demodulator

RSSI Curves(example of next point C equal to point B due to IF gain changes)

US 8,457,573 B2

AUTOMATIC GAIN CONTROL WITH STATE MACHINE CONTROLLER FEEDBACK

This application claims the benefit, under 35 U.S.C. §365 of International Application PCT/US2008/000552, filed Jan. 16, 2008, which was published in accordance with PCT Article 21(2) on Jul. 23, 2009 in English.

FIELD OF THE INVENTION

The present invention relates to an automatic gain control (AGC) circuit and, in particular, to an automatic gain control circuit that provides feedback to a demodulator and receives feedback from the demodulator.

BACKGROUND OF THE INVENTION

Most, if not all, of the IEEE 802 wireless systems are pulse-based transmit/receive systems. While the frequency of the next transmission is known in most cases, the time, length of packet, and signal strength are all unknown until a transmission occurs. Once a transmission occurs, a receiver must tune the radio frequency (RF) and intermediate frequency (IF) sections to recover the transmitted signal and to stabilize the amplifiers before the actual data in the payload is received. This very short time needs to have all of the demodulations operating as quickly as possible. If the feedback of the recovered signal is too soon or too late, the AGC can become unstable due to incorrect feedback timing. By sending the states from an AGC state machine controller, the backend system demodulators will know exactly where the front end is with respect to the gain changes, the time constants used for the system delays, and the periods when the backend can sample the signal and report the condition of the signal (too high or too low) back to the AGC.

The systems that exist have an AGC that attempts to converge on a training signal and provides feedback but not in a robust or predictable manner since the received signal is questionable until the AGC stops making changes. The prior art AGC circuits receive inputs from and provide inputs to the IF and RF amplifiers. There is, however, no input to or feedback from the demodulator in prior art AGC circuits.

SUMMARY OF THE INVENTION

Wireless systems based on IEEE 802.11 are pulse-based systems that send and received packets without having a constant carrier. The automatic gain control (AGC) circuit of these systems must react very quickly to lock in on the frequency and amplitude of the incoming signal very quickly. The present invention feeds the AGC state machine controller states to the baseband demodulators to help optimize the filter and timing during the demodulation process. The demodulations can predict the delays and conditions of the RF and IF sections based on the state machine controller states and provide feedback to the gain control.

An automatic gain control circuit is described including a state machine controller for adjusting intermediate frequency gain and radio frequency gain and a baseband demodulator, wherein the baseband demodulator receives information from the state machine controller regarding status of the state machine controller and further wherein the state machine controller receives correlation information from the baseband demodulator. Also described is a method including detecting a signal, providing state machine controller information to a baseband demodulator, reducing a radio frequency gain, reducing an intermediate frequency gain and receiving correlation information from the baseband demodulator.

BRIEF DESCRIPTION OF THE DRAWINGS

The present invention is best understood from the following detailed description when read in conjunction with the accompanying drawings. The drawings include the following figures briefly described below.

DETAILED DESCRIPTION OF THE PREFERRED EMBODIMENTS

Figure 1:
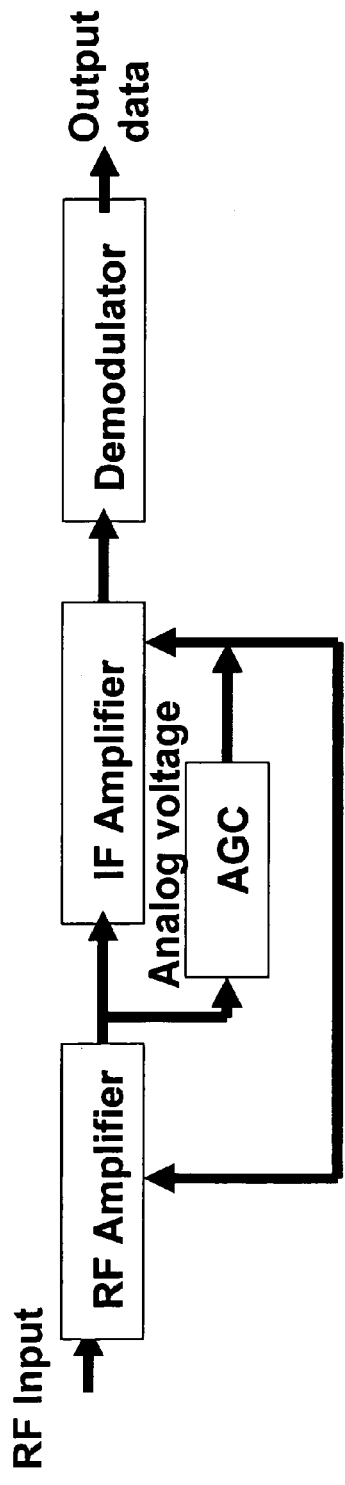
FIG. 1 is a conventional automatic gain control circuit.

FIG. 1 is a conventional automatic gain control circuit. In a conventional AGC circuit the AGC controls the RF and IF gains. In most RF systems, there is a constant carrier that the AGC can locate and track over a long time period. In many of today's wireless systems, a pulse-based system exists where reaction time and convergence is vital to data recovery.

Figure 2:
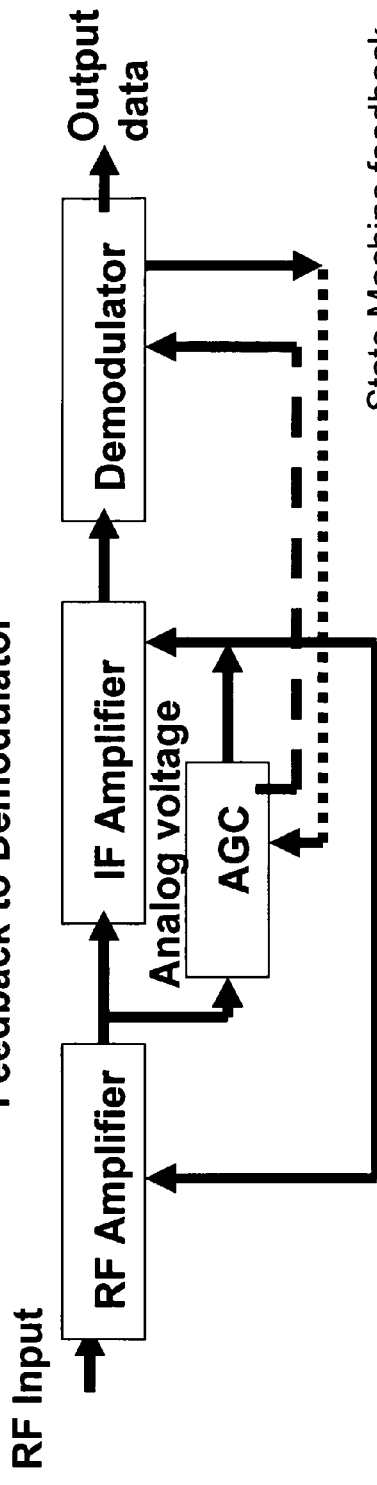
FIG. 2 is an automatic gain control circuit in accordance with the principles of the present invention.

FIG. 2 is an automatic gain control circuit in accordance with the principles of the present invention. The AGC circuit of the present invention receives input from the RF amplifier as in the conventional AGC circuit. The AGC circuit of the present invention also provides input to the IF amplifier and feedback to the RF amplifier again as in the conventional AGC circuit. The AGC circuit of the present invention includes a state machine controller and provides state machine controller feedback to the baseband demodulators and receives feedback from the demodulators.

Figure 3:
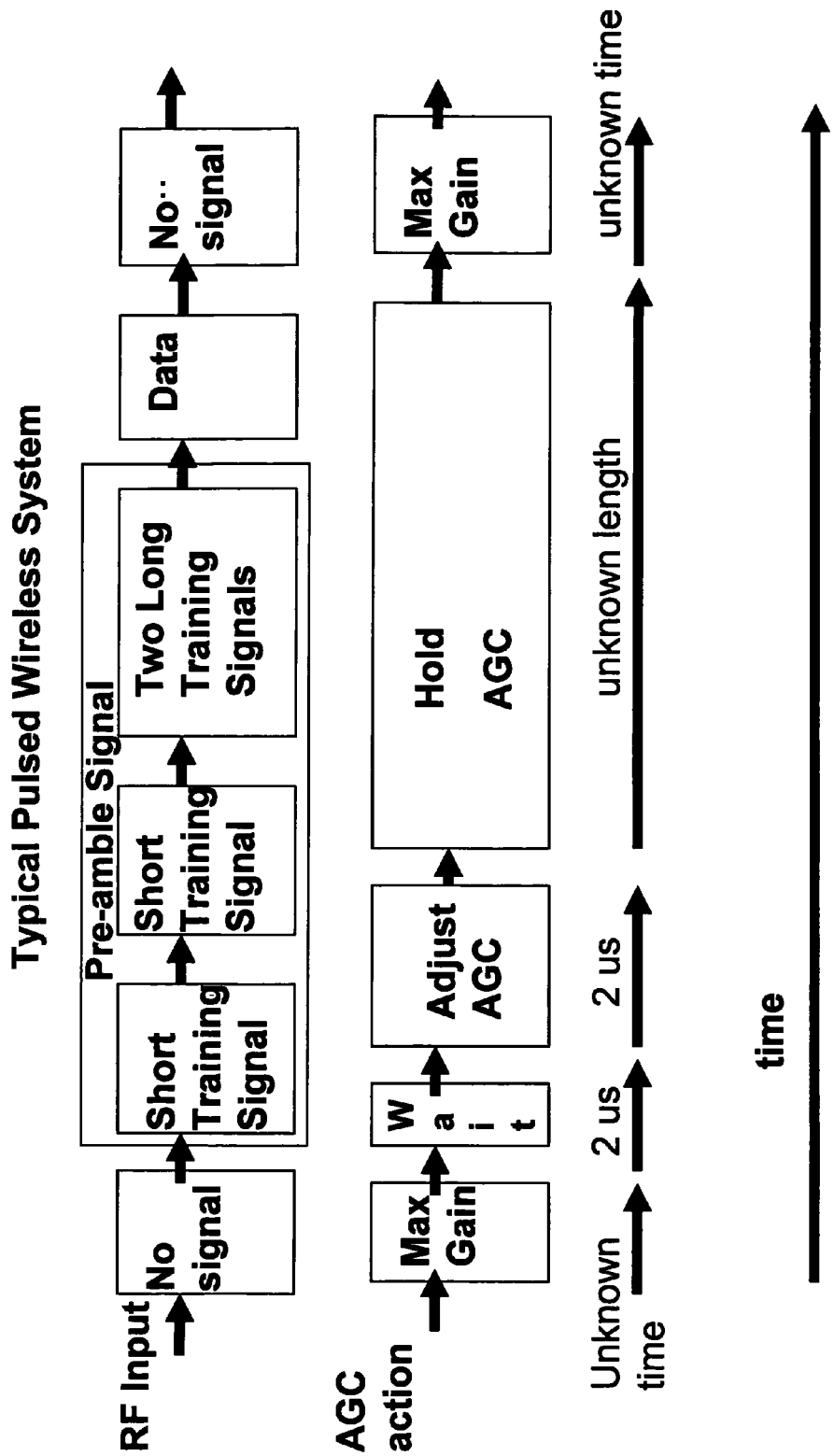
FIG. 3 depicts the training signals and data packets in a pulse-based system.

FIG. 3 depicts the training signals and data packets in a pulse-based system. There is dead space with no transmission, a preamble including two short and two long training signals, and then the data packets. The AGC must adjust the RF and IF amplifiers to optimize the signal-to-noise ratio of the incoming signal level within the approximately 4 µs of the short training signals to allow fine adjustments of phasing during the long training signals.

Figure 4:
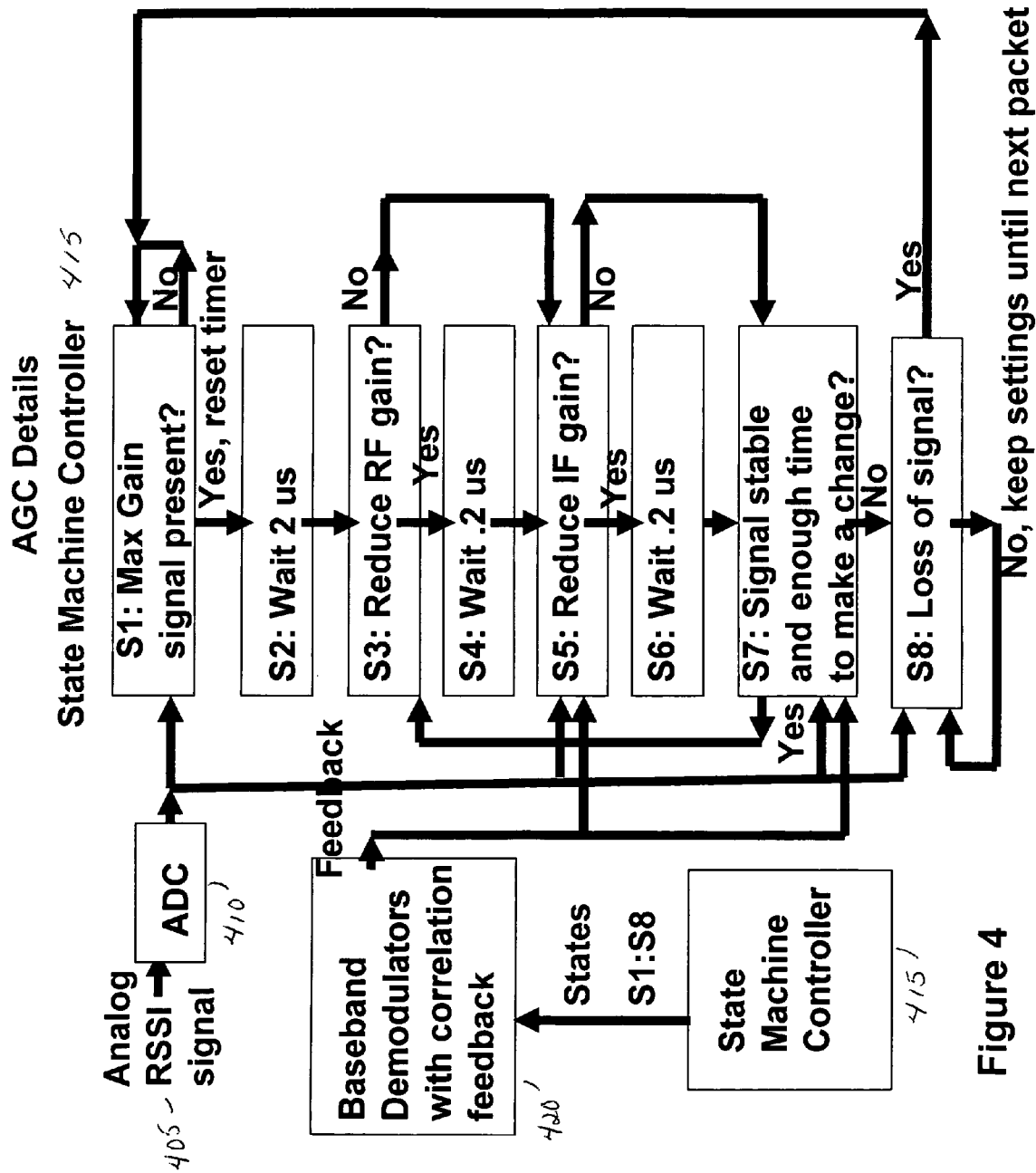
FIG. 4 is a state diagram for the state machine controller of the automatic gain control circuit of the present invention.

FIG. 4 is a state diagram for the state machine controller of the automatic gain control circuit of the present invention. The AGC state machine controller of the present invention provides feedback to the baseband demodulators. By allowing the baseband demodulators to follow the states of the AGC state machine controller, they can select the appropriate filter(s), set delays before starting to sample, and adjust the timing when to send a response back to the AGC for feedback.

The feedback that the baseband demodulators provide is a cross correlation value based on an expected received value versus the actual incoming value. This feedback value from the baseband demodulators varies from 0 to 1. A value of 0 represents no correlation between the incoming signal with an expected incoming signal while a value of 1 represents an incoming signal that perfectly matches the expected signal. This correlation value is usually found in the range of 0.25 to 0.85. Since most of the gain control of the system is in the digital domain, the closed loop performance and the feedback timing can occur within a few clock signals precision. This can minimize the delay through the loop while still avoiding a reaction before the adjustments settle that can cause oscillations.

Specifically, an analog received signal strength indication (RSSI) 405 is received by the analog-to-digital converter (ADC) 410 of the AGC circuit. The AGC circuit of the present invention has a state machine controller 415. The state machine controller 415 provides input to the baseband demodulators 420 and, of course, controls the operation of the AGC of the present invention. At the initial state S1 of the state machine controller, the gain is set to the maximum. State S1 is in a closed loop with itself waiting to receive a signal. Once a signal is received, which is detected by a large change in the RSSI value, the timer is reset and a delay is invoked as shown in S2. The delay in S2 allows the system to settle in time before any action is taken to control the AGC. This delay is necessary to make a meaningful measurement of the signal strength. If the delay of S2 was not included, positive feedback could be provided and the system would oscillate. It is assumed that the signal present during the S2 interval is the preamble and the short (first) training signal. At this point the AGC circuit proceeds to state S3 where it receives feedback from the baseband demodulators 420 and RSSI 405 (via ADC 410) and determines if the RF gain should be reduced. Note that the baseband demodulators will know from the state when a valid measurement can be made to avoid sampling during the gain changes and during the wait periods. The value of the feedback of the RSSI signal and the correlation signal feedback from the baseband demodulators indicate if the RF gain or IF gain needs to be reduced. The first iteration through this loop, the coarse level of the RF gain can be made based only on the RSSI value. The additional iterations through this loop can be used to finely adjust the IF gain to help optimize the S/N ratio assuming that the timer shows that another increment of adjustment is possible before the long training signal starts. If the RF gain should be reduced then the state machine controller reduces the RF gain and then proceeds to state S4 to wait for a time interval, such as 0.2 μs, to allow the RF and IF amplifiers and baseband demodulators to settle or stabilize before trying to sample the signal. After the time interval passes, such as 0.2 seconds, the state machine controller proceeds to state S5 to determine if the IF gain should be reduced.

If at state S3 a determination is made that the RF gain should not be reduced then the state machine controller bypasses state S4 and proceeds directly to state S5. It is usually desirable to reduce the IF gain when possible rather than reduce the RF gain to help optimize the S/N ratio. If the IF gain should be reduced then the state machine controller reduces the IF gain and then proceeds to state S6 to wait for a time interval, such as 0.2 μs, to allow the RF and IF amplifiers and baseband demodulators to settle or stabilize before trying to sample the signal again. At state S7, the state machine controller either proceeds back to state S3 or to state S8. If at state S5 a determination is made that the IF gain should not be reduced then the state machine controller bypasses state S6 and proceeds directly to state S7. At state S7, the baseband demodulators can make another correlation measurement and feed the value to the state machine controller. The correlation value along with the RSSI signal can be used to see if the RF or IF AGC gain needs to be adjusted again. If there is enough time for another adjustment, the state controller will go back to S3. If no more time is left before the long training signal starts, the AGC values are held and the controller moves to S8. At state S8, a determination is made if the signal has changed such as large drop in voltage of the RSSI signal which would imply that the transmission has ended. If the signal has changed then the state machine controller proceeds back to state S1 to wait for the next transmission. If the signal has not changed then the state machine controller proceeds back to state S8. At all times the state machine controller is aware of which state the AGC of the present invention is in and provides that input to the baseband demodulators 420.

Figure 5:
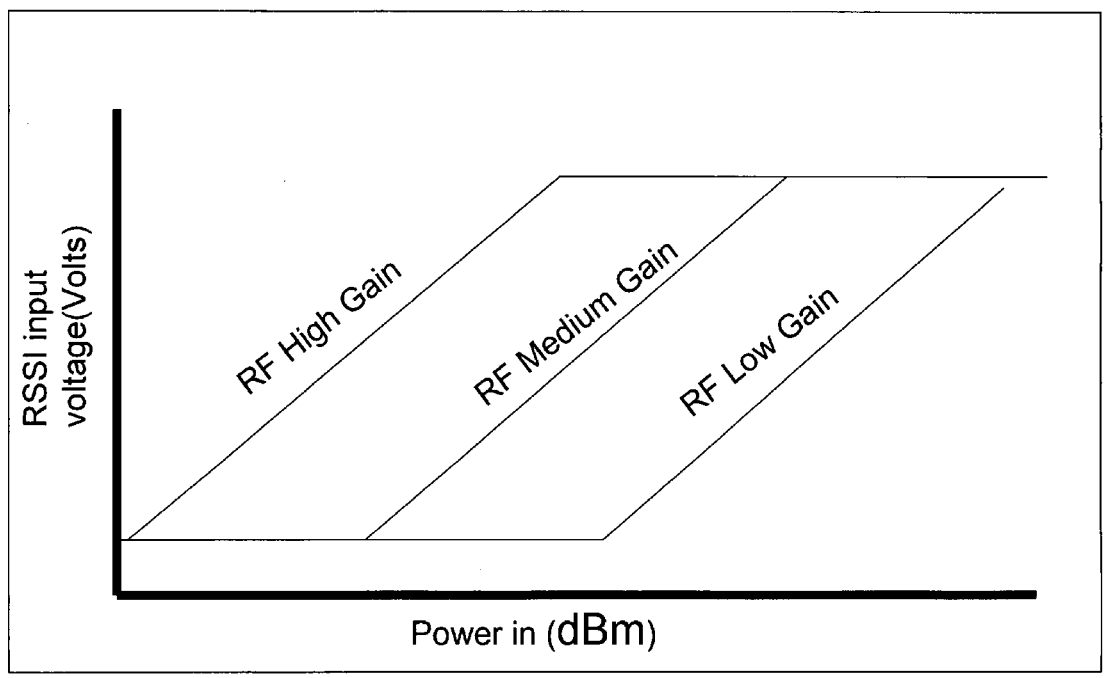
FIG. 5 shows the RSSI curves which provides the main signal strength indicator for RF signal to the AGC.
Figure 6:
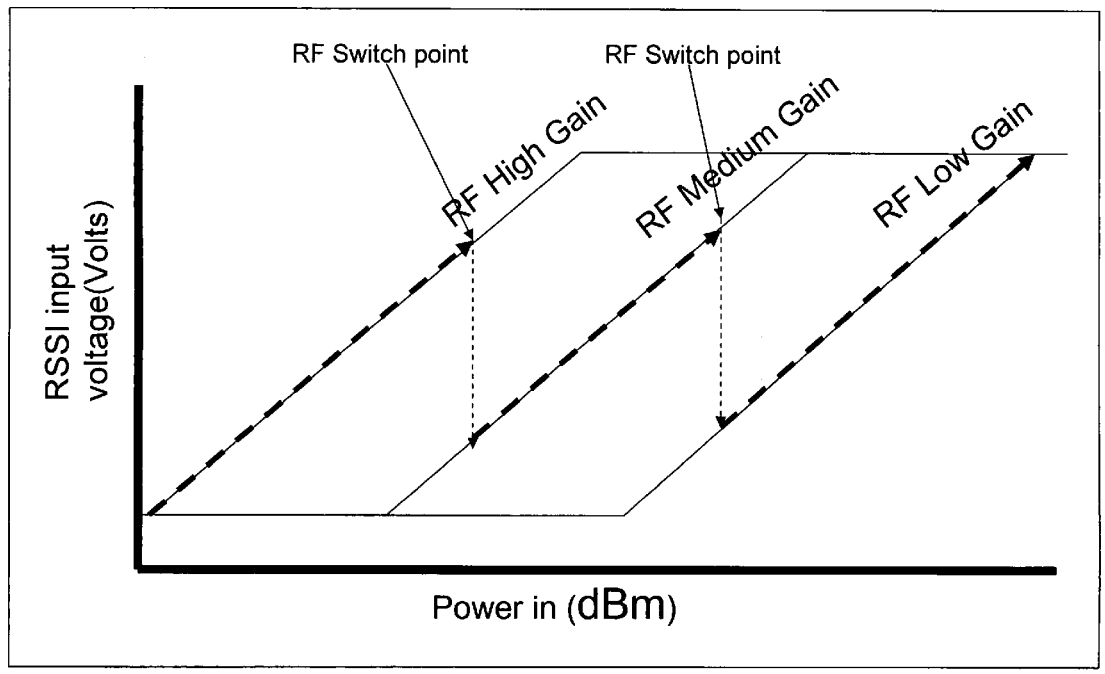
FIG. 6 shows the switch points of the RF gain settings on the RSSI curve.
Figure 7:
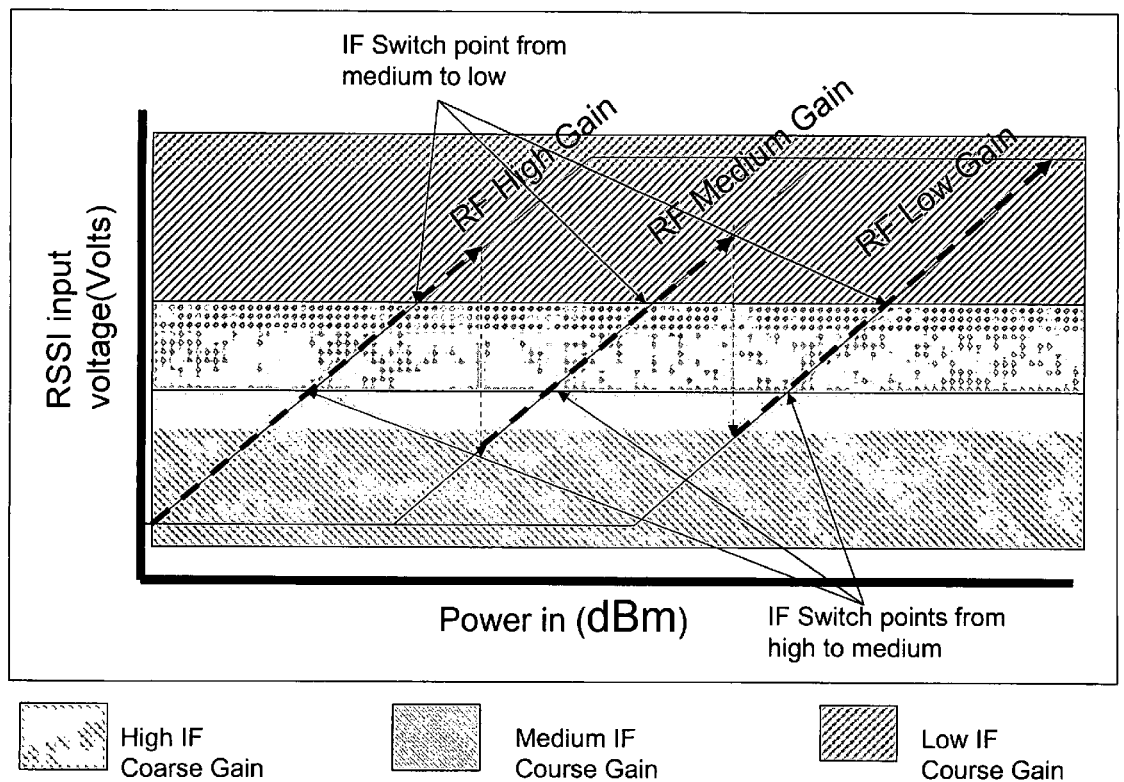
FIG. 7 shows the IF coarse gain settings on the RSSI curve.

FIG. 5 shows a typical RSSI curve with signal strength versus RF gain settings and the RSSI feedback signal in volts. FIG. 6 shows the RF gain switch points as a function of voltage on the RSSI curve to help direct the AGC controller to know when to change the RF AGC. If the RSSI value is above the switch point on the curve, the RF gain would be reduced to try to get the RSSI signal within the desired operating ranges shown on the dotted line in FIG. 6. The RSSI curve can also help determine how to set the coarse IF AGC. FIG. 7 shows an example of the coarse IF AGC switch settings when the RF AGC setting is set at either high, medium, or low.

Figure 8:
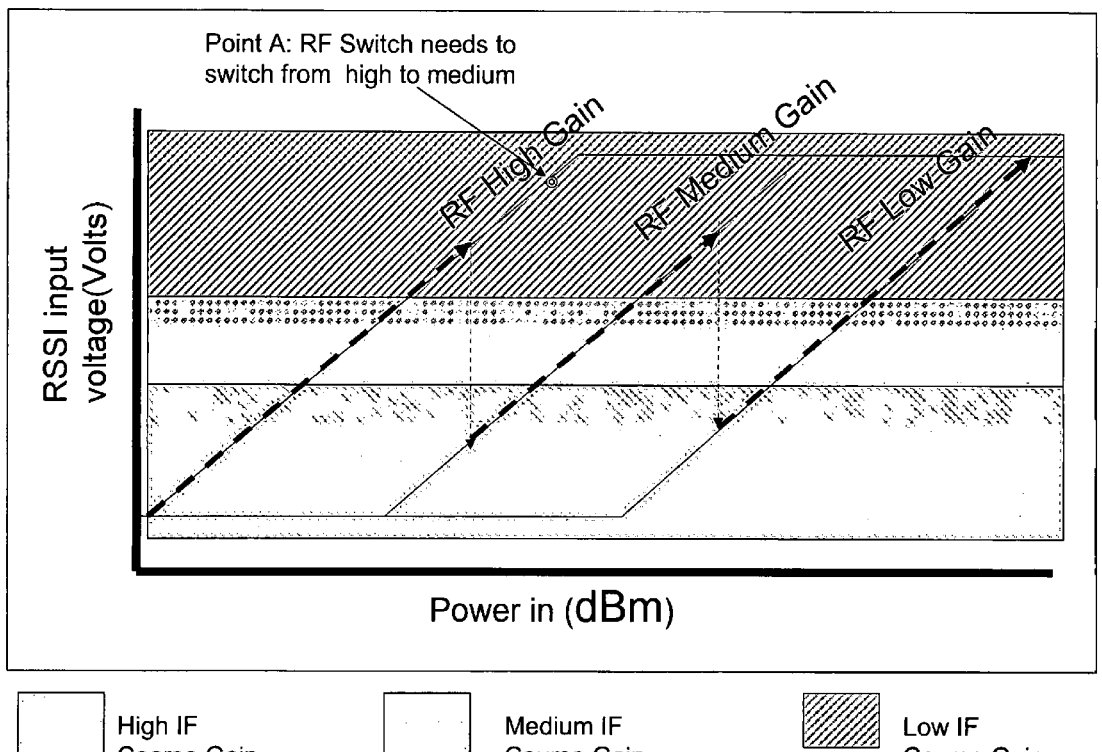
FIG. 8 shows an example of a typical incoming signal at the start of a received signal with Point A showing the RSSI value.
Figure 9:
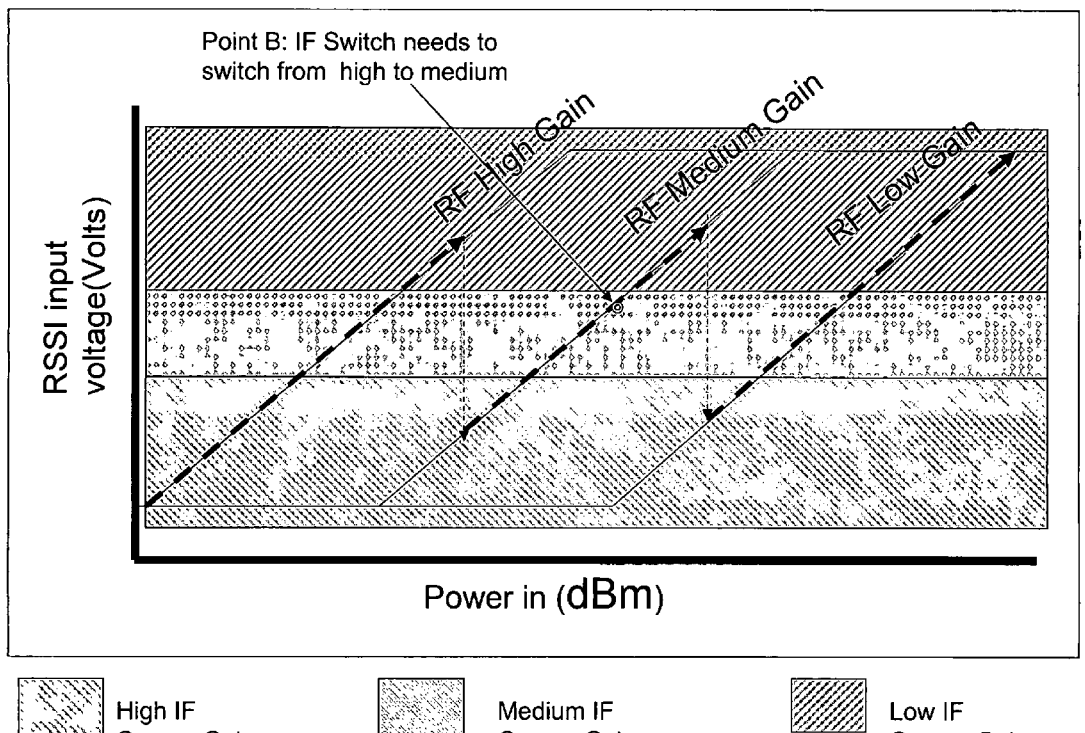
FIG. 9 continues the example of a typical incoming signal with the RSSI value at Point B after the RF gain was reduced from high to medium from FIG. 8.
Figure 10:
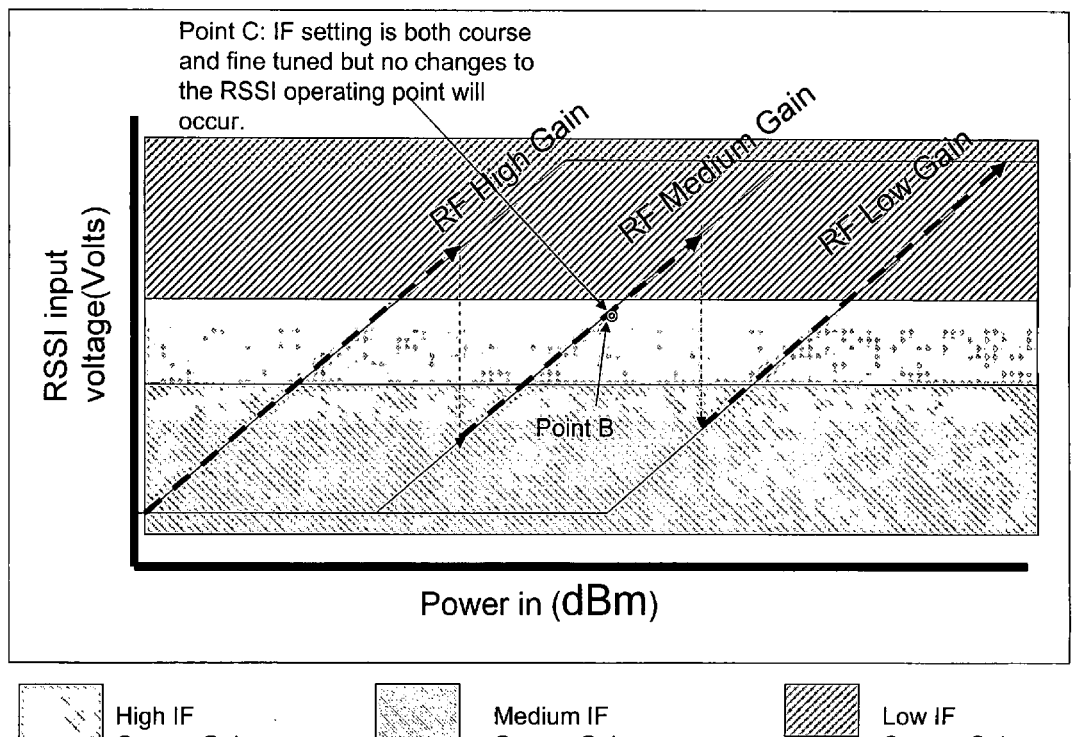
FIG. 10 continues the example of a typical incoming signal with the RSSI value at Point C after fine tuning the IF gain from Point B from FIG. 9.

An example of how the controller works is given in FIG. 8 through FIG. 10. FIG. 8 show Point A that might be the operating voltage of the RSSI at the start of a new packet. Point A is off the desired curve shown by the dotted line on FIG. 8 by being too high in value for the RF High Gain setting. The state machine controller would reduce the RF gain to the Medium Gain setting in state S3 and then retest the signals to check the new settings. Point B on FIG. 9 shows the new RSSI value after the RF gain was changed and S4 delay occurred. Since Point B is now on the desired operating range of the RF gain shown by the dotted line, the RF gain is considered stable. The RSSI value shows that the IF coarse gain still needs to be changed from high to medium as shown in FIG. 9 to help optimize the S/N ratio. Note that no changes will occur in the RSSI signal when IF gain changes are made but the RSSI value can be used to set the IF coarse gain settings. Now the correlation signal value from the baseband demodulators will be the main factor in making further changes in the IF AGC. Given that enough time remains before the long training signal begins, the controller can make small changes in the IF AGC to help optimize S/N ratio by monitoring the cross-correlation signal fed back from the baseband demodulators to the state machine controller.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

The invention claimed is:

1. An automatic gain control circuit, comprising:
   a controller for adjusting intermediate frequency gain and radio frequency gain;
   a baseband demodulator, wherein said baseband demodulator receives information from said controller regarding status of said controller and further wherein said controller receives correlation information from said baseband demodulator; and
   an analog-to-digital converter for receiving a received signal strength indicator, wherein a start of a signal is indicated by a large increase in the received signal strength indicator, wherein said controller suspends processing for a first pre-determined time period after detecting the start of the signal, wherein said controller determines if said radio frequency gain should be reduced based upon feedback from said baseband demodulator and said received signal strength indicator, wherein said radio frequency gain is reduced after said first pre-determined time period, if it is determined that said radio frequency gain should be reduced, wherein said controller further suspends processing for a second pre-determined period of time after said radio frequency gain has been reduced, wherein said intermediate frequency gain is reduced after said second pre-determined time period after said radio frequency has been reduced, wherein a determination is made if there is enough time before data is received to make an additional gain adjustment to said radio frequency and to said intermediate frequency.

2. The automatic gain control circuit according to claim 1, wherein an end of a signal is indicated by a large decrease in the received signal strength indicator.

3. The automatic gain control circuit according to claim 1, wherein if there is enough time before data is received to make said additional adjustment to said radio frequency and to said intermediate frequency, then another iteration of gain adjustments to said radio frequency and to said intermediate frequency are performed.

4. The automatic gain control circuit according to claim 1, wherein if there is not enough time before data is received to make said additional adjustment to said radio frequency and to said intermediate frequency, then current gain setting are held until data reception has ended indicated by said large decrease in said received signal strength indicator.

5. A method, said method comprising:
   detecting a signal by receiving a received signal strength indicator, wherein a start of said signal is indicated by said large increase in said received signal strength indicator;
   providing controller information to a baseband demodulator;
   determining if a radio frequency gain and an intermediate frequency gain should be reduced according to said correlation information and said received signal strength indicator;
   reducing said radio frequency gain gain and waiting for a first pre-determined time period after said radio frequency gain has been reduced, if it was determined that said radio frequency gain should be reduced;
   reducing said intermediate frequency gain, if it was determined that said intermediate frequency gain should be reduced;
   receiving correlation information from said baseband demodulator; and
   suspending processing for a second pre-determined time period after said radio frequency gain has been reduced; and
   determining if there is enough time before data is received to make additional radio frequency and intermediate frequency gain adjustments.

6. The method according to claim 5, further comprising suspending processing for a first pre-determined time period after said signal is detected.

7. The method according to claim 5, further comprising suspending processing for a third pre-determined time period after said intermediate frequency gain has been reduced.

8. The method according to claim 5, if said determination indicated there was enough time to make additional radio frequency and intermediate frequency adjustments then performing said providing, reducing and receiving acts are repeated.

9. The method according to claim 5, if said determination indicated
   there was not enough time to make additional radio frequency and intermediate
   frequency adjustments then holding said radio frequency gain setting and said
   intermediate frequency gain setting during data reception.

* * * * *